(12) United States Patent
Oh et al.

(10) Patent No.: US 9,564,564 B2
(45) Date of Patent: Feb. 7, 2017

(54) LIGHT EMITTING DEVICE AND LIGHTING APPARATUS HAVING THE SAME

(71) Applicant: LG INNOTEK CO., LTD., Seoul (KR)

(72) Inventors: Sung Joo Oh, Seoul (KR); Bong Kul Min, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/819,952

(22) Filed: Aug. 6, 2015

(65) Prior Publication Data

US 2015/0340580 A1    Nov. 26, 2015

Related U.S. Application Data

(63) Continuation of application No. 14/153,425, filed on Jan. 13, 2014, now Pat. No. 9,136,452.

(30) Foreign Application Priority Data

Jan. 14, 2013   (KR) .................. 10-2013-0003825

(51) Int. Cl.
*H01L 33/00* (2010.01)
*H01L 33/62* (2010.01)
(Continued)

(52) U.S. Cl.
CPC .............. *H01L 33/62* (2013.01); *H01L 33/486* (2013.01); *H01L 33/54* (2013.01); *H01L 33/58* (2013.01);
(Continued)

(58) Field of Classification Search
CPC .................................. H01L 33/54; H01L 33/62
(Continued)

(56) References Cited

U.S. PATENT DOCUMENTS 6,936,855 B1    8/2005    Harrah
2005/0093430 A1   5/2005    Ibbetson et al.
(Continued)

FOREIGN PATENT DOCUMENTS

CN   102646777 A   8/2012
EP   2 187 459 A2   5/2010
(Continued)

OTHER PUBLICATIONS

European Search Report for Application 14151065.1 dated Dec. 7, 2015.
(Continued)

*Primary Examiner* — Benjamin Sandvik
*Assistant Examiner* — Herve Assouman
(74) *Attorney, Agent, or Firm* — KED & Associates LLP

(57) ABSTRACT

Disclosed are a light emitting device. The light emitting device include first and second lead frames, a first body on the first and second lead frames and including an open region, a second body on the first body and including a first opening, a light emitting chip on the opening region, and a transmissive layer on the light emitting chip. The first body and the second body are formed of a resin material. A top surface of the first body is located at a position lower than a position of a top surface of the light emitting chip. The second body includes a bottom surface located at a position lower than the position of the top surface of the light emitting chip. The first body comprises an inclined part around the light emitting chip. The first body includes a reflectance material and the second body includes a transmissive material.

20 Claims, 13 Drawing Sheets

(51) Int. Cl.
*H01L 33/58* (2010.01)
*H01L 33/54* (2010.01)
*H01L 33/48* (2010.01)
*H01L 33/60* (2010.01)

(52) U.S. Cl.
CPC ..... *H01L 33/60* (2013.01); *H01L 2224/48091* (2013.01); *H01L 2224/48247* (2013.01)

(58) Field of Classification Search
USPC .................................................. 257/88, 98
See application file for complete search history.

(56) References Cited

U.S. PATENT DOCUMENTS

| | | |
|---|---|---|
| 2007/0241342 A1 | 10/2007 | Inoue et al. |
| 2007/0262328 A1 | 11/2007 | Bando |
| 2011/0062470 A1 | 3/2011 | Bierhuizen et al. |
| 2011/0089453 A1* | 4/2011 | Min .................. H01L 33/60 257/98 |
| 2011/0175132 A1 | 7/2011 | Kwon et al. |
| 2011/0233571 A1* | 9/2011 | Park .................. H01L 33/486 257/88 |
| 2011/0260199 A1* | 10/2011 | Andrews ............ H01L 33/486 257/99 |
| 2011/0303941 A1* | 12/2011 | Lee ................... H01L 33/486 257/98 |
| 2012/0037944 A1 | 2/2012 | Takine |
| 2012/0205708 A1 | 8/2012 | Yoo et al. |
| 2014/0008687 A1 | 1/2014 | Jang |
| 2015/0171300 A1 | 6/2015 | Seo et al. |

FOREIGN PATENT DOCUMENTS

| | | |
|---|---|---|
| EP | 2 323 183 A1 | 5/2011 |
| JP | 2006-086178 A | 3/2006 |
| JP | 2006-519500 | 8/2006 |
| JP | 2007-49152 | 2/2007 |
| JP | 2007-281250 A | 10/2007 |
| JP | 2008-098218 A | 4/2008 |
| JP | 2009-200531 A | 9/2009 |
| JP | 2010-123908 A | 6/2010 |
| JP | 2010-238833 A | 10/2010 |
| JP | 2011-253910 A | 12/2011 |
| JP | 2012-039120 A | 2/2012 |
| JP | 2012-054280 A | 3/2012 |
| JP | 2012-069885 A | 4/2012 |
| JP | 2012-209367 | 10/2012 |
| JP | 2012-216654 | 11/2012 |
| WO | WO 2010-095482 A2 | 8/2010 |
| WO | WO 2010/150754 A1 | 12/2010 |

OTHER PUBLICATIONS

Japanese Office Action dated Nov. 20, 2014 issued in Application No. 2014-002825.
U.S. Office Action for U.S. Appl. No. 14/153,425 dated Oct. 24, 2014.
U.S. Notice of Allowance for U.S. Appl. No. 14/153,425 dated May 8, 2015.
Korean Office Action issued in Application No. 201410016572.9 dated Mar. 17, 2016.
Japanese Office Action for Application 2015-149685 dated Jun. 7, 2016 (full Japanese text).

* cited by examiner

LIGHT EMITTING DEVICE AND LIGHTING APPARATUS HAVING THE SAME

CROSS REFERENCE TO RELATED APPLICATION

This application is a Continuation Application of co-pending U.S. patent application Ser. No. 14/153,425 filed on Jan. 13, 2014, which claims priority under 35 U.S.C. §119(a) of Korean Patent Application No. 10-2013-0003825 filed on Jan. 14, 2013, which is hereby incorporated by reference in its entirety.

BACKGROUND

The embodiment relates to a light emitting device and a lighting apparatus having the same.

Light emitting devices, for example, light emitting diodes (LEDs) are semiconductor devices that convert electric energy into light and extensively used as next-generation light sources in place of conventional fluorescent lamps and glow lamps.

Since the LED generates the light by using the semiconductor device, the LED may represent low power consumption as compared with the glow lamp that generates the light by heating tungsten or the fluorescent lamp that generates the light by urging ultraviolet ray, which is generated through the high-voltage discharge, to collide with a fluorescent substance.

In addition, the LED generates the light by using the potential gap of the semiconductor device, so the LED is advantageous as compared with conventional light sources in terms of life span, response characteristics, and environmental-friendly requirement.

In this regard, various studies have been performed to replace the conventional light sources with the LEDs. The LEDs are increasingly used as light sources for lighting devices, such as various lamps used indoors and outdoors, liquid crystal displays, electric signboards, and street lamps.

SUMMARY

The embodiment provides a light emitting device having a wide viewing angle.

The embodiment provides a light emitting device including a first body which is provided around a light emitting chip and has reflectance higher than transmittance, and a second body which is provided on the first body and has transmittance higher than reflectance.

The embodiment provides a first body which is coupled into a lead frame and has an inclined surface equal to or less than 5 degrees.

The embodiment provides a light emitting device including a light emitting chip and a resin layer in open regions of first and second bodies.

The embodiment provides a light emitting device including a coupling structure which is provided around an open region of a first body and in which a concave region lower than a top surface of the first body overlaps a recess region of a lead frame.

The embodiment provides a light emitting device including first and second bodies which have mutually different materials and are disposed around a light emitting chip, and a lighting apparatus having the same.

According to the embodiment, there is provided a light emitting device including a first lead frame including a first bonding region; a second lead frame including a second bonding region; a gap part disposed between the first and second lead frames; a first body coupled to the first and second lead frames and including an open region exposing the first and second bonding regions; a second body coupled onto the first body and including a first opening on the open region of the first body; a light emitting chip on the second bonding region of the second lead frame; and a transmissive resin layer surrounding the light emitting chip in the open region of the first body and the first opening of the second body, wherein the first body comprises a material having reflectance higher than reflectance of the second body, a top surface of the first body is located at a position lower than a position of a top surface of the light emitting chip, the first body comprises an inclined inner part around the open region, and the first lead frame comprises a first hole which is disposed under the inner part of the first body and has an area greater than an area of a bottom surface of the light emitting chip.

According to the embodiment, there is provided a light emitting device including a first lead frame including a first bonding region; a second lead frame including a second bonding region; a gap part disposed between the first and second lead frames; a first body coupled to the first and second lead frames and including an open region exposing the first and second bonding regions; a second body coupled onto the first body and including a first opening on the open region of the first body; a light emitting chip on the second bonding region of the second lead frame; and a transmissive resin layer surrounding the light emitting chip in the open region of the first body and the first opening of the second body, wherein a top surface of the first body is located at a position lower than a position of a top surface of the light emitting chip, the first body comprises an inclined inner part around the open region, the first lead frame comprises a first hole which is disposed under the inner part of the first body and has an area greater than an area of a bottom surface of the light emitting chip, the first body is formed of a material having reflectance of 70% or more with respect to light emitted from the light emitting chip, and the second body includes a material that transmits 70% or more of light emitted from the light emitting chip.

DETAILED DESCRIPTION OF THE EMBODIMENTS

Figure 1:
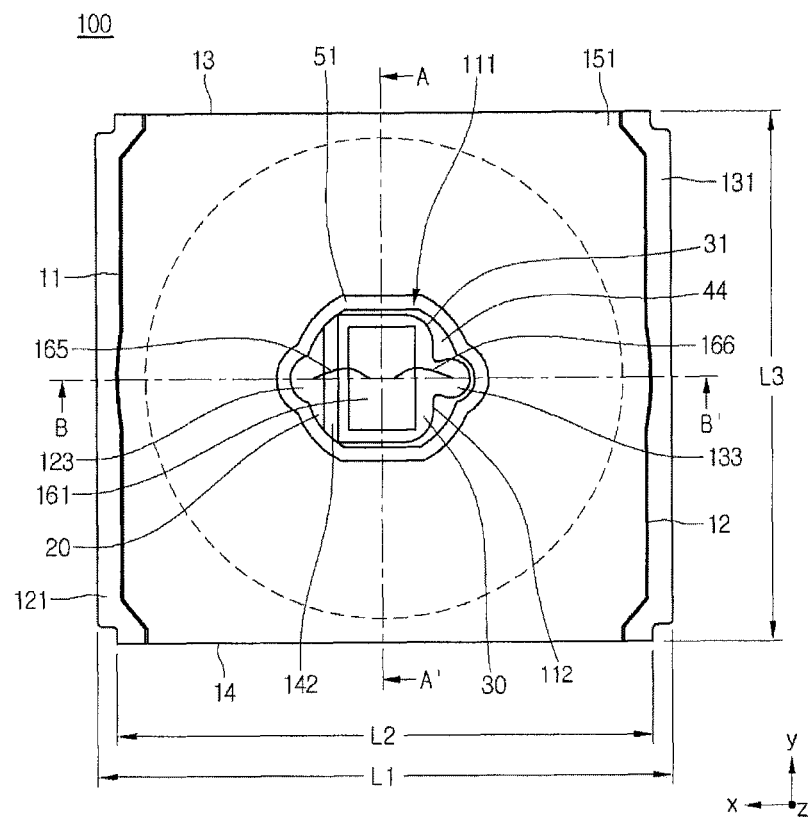
FIG. 1 is a plan view showing a light emitting device according to a first embodiment.

Hereinafter, embodiments will be clearly comprehended by those skilled in the art with reference to accompanying drawings and the description of the embodiments. In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size. The same reference numbers will be assigned the same elements throughout the drawings.

Hereinafter, a light emitting device according to the embodiment will be described with reference to the accompanying drawings.

Figure 2:
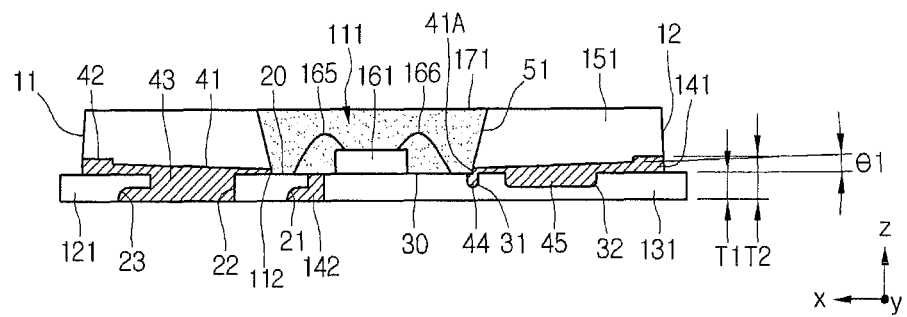
FIG. 2 is a side sectional view taken along line A-A' of the light emitting device of FIG. 1.
Figure 3:
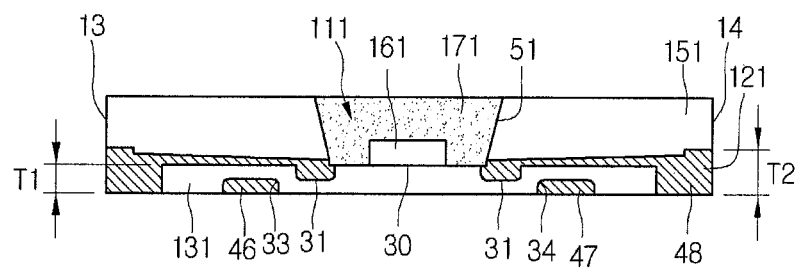
FIG. 3 is a side sectional view taken along line B-B' of the light emitting device of FIG. 1.

FIG. 1 is a plan view showing a light emitting device according to a first embodiment. FIG. 2 is a side sectional view taken along line A-A' of the light emitting device of FIG. 1. FIG. 3 is a side sectional view taken along line B-B' of the light emitting device of FIG. 1. FIGS. 4 to 7 are side views showing first to fourth side surfaces of the light emitting device of FIG. 1.

Referring to FIGS. 1 to 7, the light emitting device 100 includes a plurality of lead frames 121 and 131 including a first lead frame 121 having a first bonding region 20 and a second lead frame 131 having a second bonding region 30, a first body 141 coupled to the lead frames 121 and 131, a second body 151 formed on the first body 141 and of a material different from that of the first body 141 and having a first opening 111, a light emitting chip 161 provided on the second bonding region 30 of the second lead frame 131, which is exposed in the first opening 111, and a transmissive resin layer 171 formed in the first opening 111 and surrounding the light emitting chip 161.

In the light emitting device 100, a length L1 in a first direction X may be equal to or different from a length L2 in a second direction Y. The first and second directions (X and Y) may be perpendicular to each other. The length L1 in the first direction X refers to a distance between both ends of the first and second lead frames 121 and 131 and may be formed longer than the width of the first or second body 141 or 151. The length L2 in the second direction Y may be equal to the length of the first or second lead frame 121 or 131 and may be formed to be equal to the width of the first or second body 141 or 151 in the second direction Y. In this case, the direction perpendicular to the top surface of the light emitting chip 161 may refer to the normal direction Z of the light emitting chip 161.

An outer part of the first lead frame 121 may protrude outward than a first side surface 11 of the first or second body 141 or 151. An outer part of the second lead frame 131 may protrude outward than a second side surface 12 of the first or second body 141 or 151. Thus, the adhesion of the first and second frames 121 and 131 to an adhesive member such as solder paste may be improved.

The width L3 of the light emitting device 100 or the widths of the bodies 141 and 151 is or are a gap between the first and second side surfaces 11 and 12 of the first or second body 141 or 151. The length L2 of the bodies 141 and 151 is a gap between the third and fourth side surfaces 13 and 14 of the first or second body 141 or 151 and is a length in the second direction Y. The width of the first body 141 may be equal to or wider than that of the second body 151. Further, the lengths L2 of the first and second body 141 and 151 may be equal to each other or the length of the first body 141 may be longer than that of the second body 151. The light reflective efficacy may be improved due to the area covered by the first body 141.

As shown in FIGS. 2 and 3, the first body 141 is coupled onto the first and second lead frames 121 and 131 and the second body 151 is coupled onto first body 141.

The first body 141 has a predetermined thickness and is physically coupled to the first and second lead frames 121 and 131, such that the first body 141 supports the first and second lead frames 121 and 131. A part of the first body 141 may be aligned in line with the bottom surfaces of the first and second lead frames 121 and 131. As shown in FIGS. 1 and 2, the first body 141 includes an open region 112 so that the first and second bonding regions 20 and 30 of the first and second lead frames 121 and 131 are exposed through the open region 112.

The first body 141 may include a material representing reflectance higher than transmittance with respect to the wavelength emitted from the light emitting chip 161. For example, the first body 141 may include a material representing at least 70% or more of reflectance. If the material constituting the first body 141 has at least 70% or more of reflectance, the material constituting the first body 141 may include a non-transmissive material. The first body 141 may be formed by using a resin-based insulating material, such as PPA (polyphthalamide). The first body 141 may be formed by using silicon, epoxy resin, thermosetting resin including a plastic material, a high heat-resistance material or a high light-resistance material. The silicon includes white resin. In addition, an acid anhydride, an antioxidant, a release agent, a light reflective material, an inorganic filler, a hardening catalyst, a light stabilizer, a lubricant, or titanium dioxide may be selectively added to the first body 141. The first body 141 may be formed by using at least one selected from the group consisting of epoxy resin, modified epoxy resin, silicon resin, modified silicon resin, acryl resin and urethane resin. For instance, the first body 141 can be formed by using B-stage solid epoxy resin composition, which can be obtained by mixing the epoxy resin, such as triglycidylisocyanurate or hydride bisphenol A diglycidylether, with the acid anhydride promoter, such as hexahydro phthalic anhydride, 3-methyl hexahydro phthalic anhydride or 4-methyl hexahydro phthalic anhydride, and then partially hardening the mixture after adding DBU (1.8-Diazabicyclo(5,4,0)undecene-7) serving as a hardening accelerator and ethylene glycol, titanium oxide pigment or glass fiber serving as a promoter to the epoxy resin, but the embodiment is not limited thereto.

In addition, a light shielding material or a dispersing agent is added in the first body 141, thereby reducing transmitting light. In addition, in order to have a predetermined function, the first body 141 includes at least one selected from the group consisting of a dispersing agent, pigments, phosphors, reflective materials, light shielding materials, a light stabilizer, and a lubricant mixed with thermal setting resin.

The first body 141 may include a resin material, such as silicon or epoxy to which metallic oxide is added. The metallic oxide may include at least one of $TiO_2$, $SiO_2$, and $Al_2O_3$. The metallic material may be added to the first body 141 at the rate of 5 wt % or more. Thus, the first body 141 may be formed of a reflective material.

The second body 151 may be formed on a surface of the first body 141. The second body 151 may include a transmissive material. For example, the second body 151 may include silicon-based resin or epoxy-based resin. The second body 151 may be formed through an injection molding scheme of an EMC (Epoxy Molding Compound) scheme. For example, the second body 151 may be formed of a transmissive material, such as transmissive resin, having no impurity, having the transmittance of 70% or more. The second body 151 allows the light emitted from the transmittance of 70% or more. The second body 151 allows the light emitted from the light emitting chip 161 or reflected from the first body 141 to effectively pass therethrough.

An area of the entire top surface of the first body 141 may be greater than that of the entire bottom surface of the second body 151, and the top surface of the first body 141 may be formed lower than a top surface of the light emitting chip 161. Thus, the light traveling toward the top surface of the first body 141 may reflect to the second body 151, so that the optical loss may be reduced.

The first opening 111 may be provided in the second body 151. The first opening 111 may correspond to an open region 112 of the first body 141, or may be greater than the open region 112 of the first body 141.

The side surface 51 of the first opening 111 may be inclined or perpendicular to the bottom of the first opening 111. The side surface 51 of the first opening 111 covers the circumstance of the first opening 111.

The first and second bonding regions 20 and 30 of the first and second lead frames 121 and 131 are exposed through the bottom of the first opening 111. A gap part 142 is provided between the first and second bonding regions 20 and 30. The gap part 142 allows the first and second bonding regions 20 and 30 to be separated from each other. The gap part 142 may be formed of a material of the first body 141 and may block the leaking light.

A first extension part 123, which protrudes in an opposite direction of the second bonding region 30 or a direction of the first side surface 11, may be formed in the first bonding region 20. The first extension part 123 may have a hemispherical shape when viewed from the top.

A second extension part 133, which protrudes in an opposite direction of the first bonding region 20 or a direction of the second side surface 12, may be formed in the second bonding region 30. The second extension part 133 may have a hemispherical shape when viewed from the top. A size of the second extension part 133 may be different from the first extension part 123. A diameter of the second extension part 133 may be narrower than anyone width of the light emitting chip 161. A curvature R2 of the first extension part 123 may be equal to or less than that of the second extension part 133.

When explaining a contour of the first opening 111, a side surface, which is connected to two side surfaces corresponding to each other, may be curved. The curved surface is connected to the curved surface of the first and second extension parts 123 and 133 having a hemispherical shape.

The light emitting chip 161 is mounted on the second bonding region 30 of the second lead frame 131, and the light emitting chip 161 may be adhesive onto the second bonding region 30, for example, with conductive or insulation adhesive.

The light emitting chip 161 is connected to the bonding region 20 through a first wire 165 and is connected to the second bonding region 30 through a second wire 166. A part of the first wire 165 is disposed in the first extension part 123 of the first bonding region 20 and a part of the second wire 166 is disposed in the second extension part 133 of the second bonding region 30. That is, the first and second extension parts 123 and 133 are regions in which balls of the first and second wires 165 and 166 are located. Further, a space, in which the wires 165 and 166 are bonded to the light emitting chip 161, may be provided without increasing an area of the first opening 111.

The first and second lead frames 121 and 131 include a metallic material, for example, at least one of titanium (Ti), copper (Cu), nickel (Ni), gold (Au), chrome (Cr), tantalum (Ta), platinum (Pt), zinc (Sn), silver (Ag) and phosphor (P) or an alloy including at least two of the above elements. The first and second lead frames 121 and 131 may be formed in a single layer or may be prepared as mutually different metallic layers, but the embodiment is not limited thereto. The first and second lead frames 121 and 131 may include a metallic material, for example, at least one of titanium (Ti), copper (Cu), nickel (Ni), gold (Au), chrome (Cr), tantalum (Ta), platinum (Pt), zinc (Sn), silver (Ag) and phosphor (P) or an alloy including at least two of the above elements. If one of the first and second lead frames 121 and 131 includes an alloy, the alloy may include a Cu alloy, such as Cu—Sn alloy, Cu—Fe alloy, Cu—Cr alloy, or Cu—Ag—Fe alloy. A thickness T1 of the first and second lead frames 121 and 131 may be in the range of 0.23 mm to 1.5 mm, for example in the range of 0.25 mm to 0.5 mm.

Figure 11:
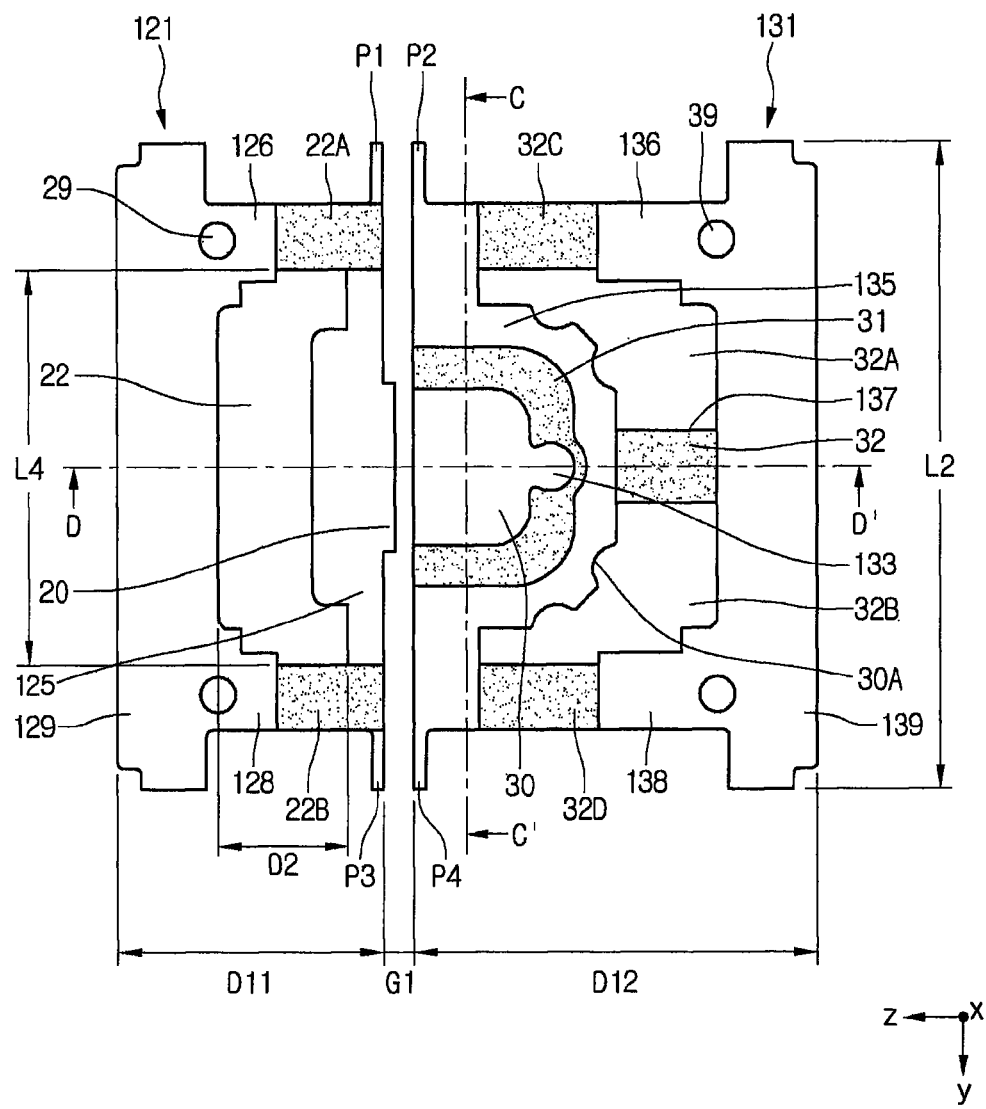
FIGS. 11 and 12 are front and plan views showing the lead frame of the light emitting device of FIG. 1.
Figure 12:
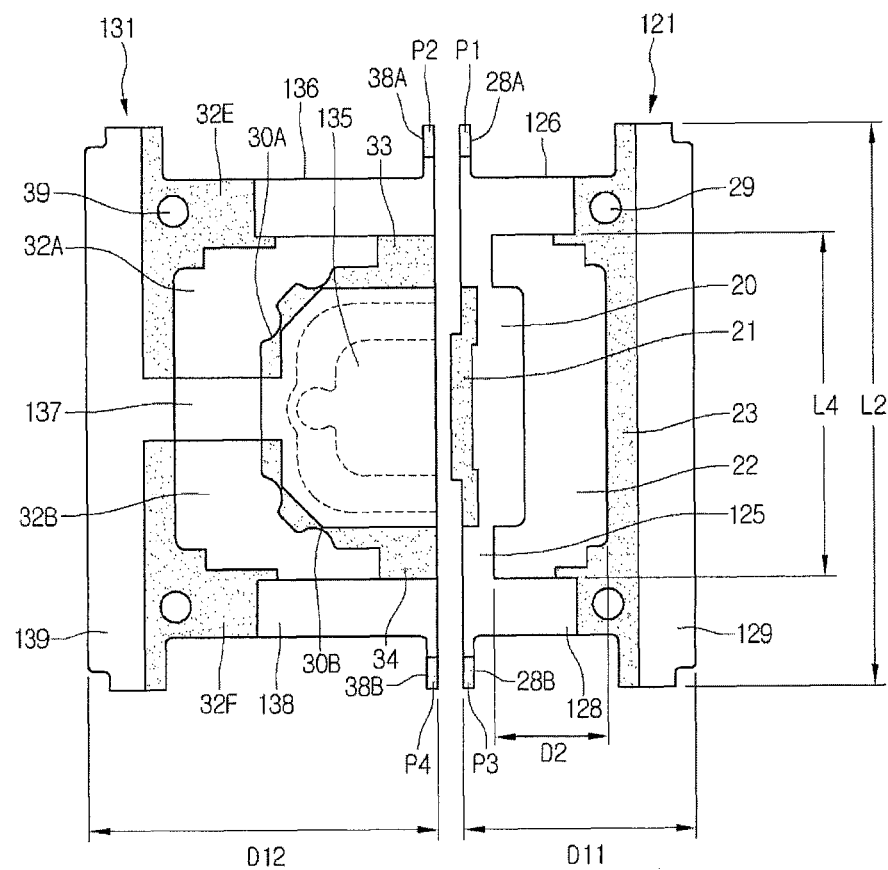
Figure 13:
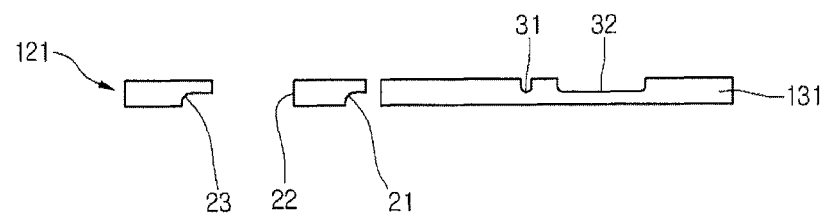
FIGS. 13 and 14 are side sectional views taken along lines C-C' and D-D' of FIG. 11, respectively.
Figure 14:
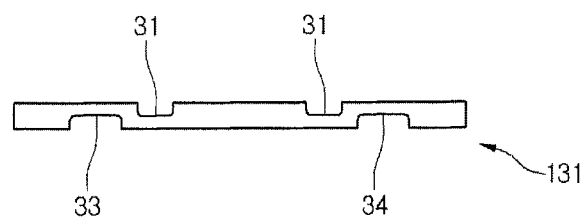

Hereinafter the structures of the first and second lead frames 121 and 131 will be described with reference to FIGS. 11 to 14. FIGS. 11 and 12 are front and rear views of the first and second lead frames 121 and 131. FIGS. 13 and 14 are side sectional views taken along lines C-C' and D-D' of FIG. 11, respectively.

Referring to FIGS. 11 to 14, the first lead frame 121 includes a first frame part 125 having the first bonding region 20, a first lead part 129 spaced apart from the first frame part 125, a first hole 22 provided between the first frame part 125 and the first lead part 129, and first and second connection parts 126 and 128 for connecting the first frame 125 to the first lead part 129. The first hole 22 is disposed between the first frame part 125 and the first lead part 129, and the first and second connection parts 126 and 128 are disposed at an outer part of the first hole 22. Since a thickness of the first and second connection parts 126 and 128 may be thinner than that of the first frame part 125 and the first lead part 129, an area making contact with the first body 141 may be increased.

Figure 6:
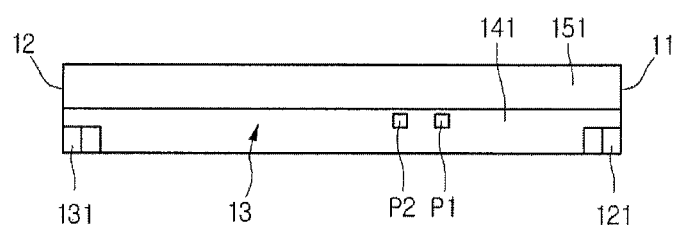
FIG. 6 is a third side view of the light emitting device of FIG. 1.
Figure 7:
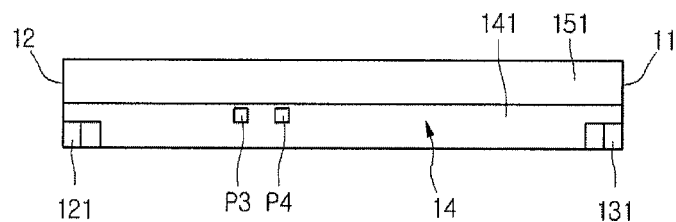
FIG. 7 is a fourth side view of the light emitting device of FIG. 1.

The first frame part 125 includes the first bonding region 20. The first frame part 125 has a length equal to the length L2 of the first lead frame 121 and is connected to the first and second connection parts 126 and 128. Both ends of the first frame part 125 include first and second protrusions P1 and P2. The first protrusion P1 protrudes outward than the first connection part 126 from the first frame part 125, and as shown in FIG. 6, is exposed to the third side surface 13 of the first body 141. The second protrusion P2 protrudes outward than the second connection part 128 from the first frame part 125, and as shown in FIG. 7, is exposed to the fourth side surface 14 of the first body 141. The first and second protrusions P1 and P2 may allow the first lead frame 121 to be supported on a side surface of the first body 141.

Figure 9:
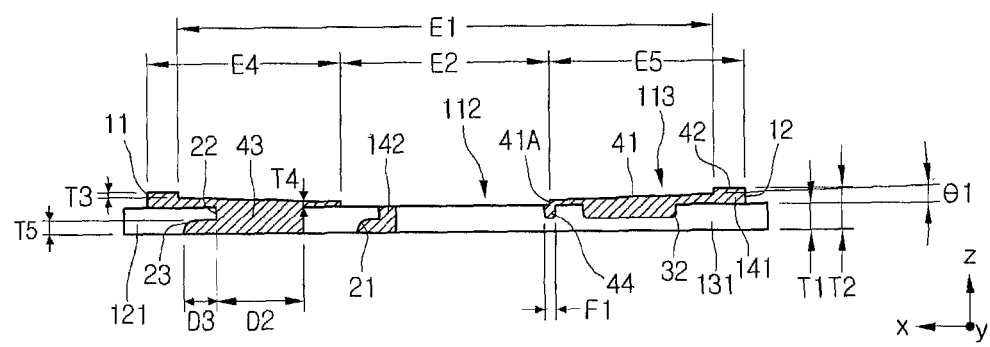
FIG. 9 is a sectional view taken along line A1-A1' of FIG. 8.

A region corresponding to the second lead frame 131 and a recess region 21 may be provided in the bottom of the first frame part 125. The recess region 21 may be wider than the width of the first opening 111. As shown in FIGS. 2 and 9, a part of the gap part 142 extends to the recess region 21 so that the width of the bottom surface of the gap part 142 may be greater the width of the top surface of the gap part 142.

In this case, a central part of the first frame part 125 may protrude toward the second lead frame 131. A gap between the central part of the first frame part 125 and the second lead frame 131 may be narrower than the gap G1 between the first and second lead frames 121 and 131.

As shown in FIG. 12, the recess regions 28A and 28B, which are recessed lower than the bottom surface of the first lead frame 121, may be provided to the first and second protrusions P1 and P2, but the embodiment is not limited thereto. The recess regions 28A and 28B may be formed at a depth of 50% or less of the thickness of the first lead frame 121, for example, in the range of 30% to 50%. Thus, the contact area with the second body 151 may be increased due to the recess regions 28A and 28B.

Figure 4:
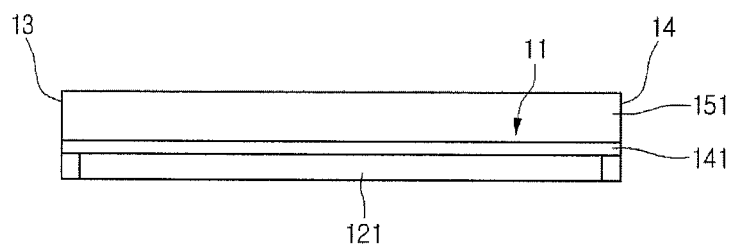
FIG. 4 is a first side view of the light emitting device of FIG. 1.
Figure 5:
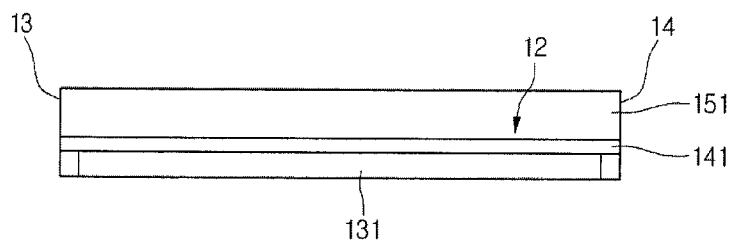
FIG. 5 is a second side view of the light emitting device of FIG. 1.

As shown in FIG. 4, a part of the first lead part 129 protrudes toward the first side surface 11 of the first body 141, has a length equal to the length L2 of the first lead frame 121, and is connected to the first and second connection parts 126 and 128.

A recess region 23, which is lower than the bottom surface of the first lead frame 121, is provided to the bottom surface of the first lead part 129. The recess region 23 may be formed at a depth (T5 of FIG. 9) of 50% or less of the thickness of the first lead frame 121, for example, in the range of 30% to 50%. A length of the recess region 23 may correspond to the length of the first lead part 129 or the length L2 of the first frame 121. The recess region 23 of the first lead part 129 may extend to parts of the first and second connection parts 126 and 128.

A plurality of coupling holes 29, which are formed in the form of a via-hole or through hole, are provided to the first lead part 129 to be coupled to the first body 141. The coupling holes 29 may be spaced apart from an outside of the first hole 22 to support the first body 141.

The first hole 22 may have a width D2 of 25% or more of the width D11 of the first lead frame 121, for example in the range of 27% to 40%, and a length L4 of 50% or more of the length L2 of the first lead frame 121, for example, in the range of 60% or more. An area of the first hole 22 may be greater than the bottom area of the first opening 111 and may be 30% or more of the top surface of the first lead frame 121. In addition, the area of the first hole 22 may be greater than the area of the bottom surface of the light emitting chip 161.

The width D2 of the first hole 22 may be in the range of 0.81 mm±0.05 mm. The width D11 of the first lead frame 121 may be in the range of 2.25 mm±0.5 mm.

Thus, as shown in FIGS. 2 and 9, a part 43 of the first body 141 is disposed in the first hole 22. The recess region 23 of the first lead part 129 is connected to the first hole 22, and the part 43 of the first body 141 coupled to the first hole 22 extends. In this case, as shown in FIG. 9, the width D3 of the recess region 23 adjacent to the first hole 22 may be 50% or more of the thickness of the first lead frame 121, but the embodiment is not limited thereto.

The contact area of the first body 141 with the first lead frame 121 may be increased, so that the coupling strength of the first body 141 which has a thickness thinner than that of the second body 151 may be enhanced.

The first and second connection parts 126 and 128 allow the first frame part 125 and the first lead part 129 to connect with each other outside the first hole 22. A recess region 22A, which is recessed lower than the top surface of the first lead frame 121, is provided in the top surface of the first connection part 126, and a recess region 22B, which is recessed lower than the top surface of the first lead frame 121, is provided in the top surface of the second connection part 128. The recess regions 22A and 22B may extend to a part of the first frame part 125.

The second lead frame 131 includes a second frame part 135 having the second bonding region 30, a second lead part 139 spaced apart from the second frame part 135, second and third holes 32A and 32B provided between the second frame part 135 and the second lead part 139, and third to fifth connection parts 136 to 138 for connecting the second frame 125 to the second lead part 139. The third to fifth connection parts 136 to 138 may be regions recessed lower than the top surface of the second lead frame 131 or may have thicknesses thinner than those of the second frame part 135 and the second lead part 139.

The second frame part 135 includes the second bonding region 30. The second frame part 135 has a length equal to the length L2 of the second lead frame 131 and is connected to the third to fifth connection parts 136 to 138. Both ends of the second frame part 135 include third and fourth protrusions P3 and P4. The third protrusion P3 protrudes outward than the third connection part 136 from the second frame part 135, and as shown in FIG. 6, is exposed to the third side surface 13 of the first body 141. The fourth protrusion P4 protrudes outward than the fifth connection part 138 from the second frame part 135, and as shown in FIG. 7, is exposed to the fourth side surface 14 of the first body 141. The third and fourth protrusions P3 and P4 may allow the second lead frame 131 to be supported on a side surface of the first body 141.

The second frame part 135 includes concavo-convex structures 30A and 30B formed at a region which makes contact with the second and third holes 32A and 32B. The concavo-convex structures 30A and 30B may protrude toward the second and third holes 32A and 32B, and recess regions 33 and 34 may be formed in the bottom surfaces of the concave structures. Parts 46 and 47 of the first body 141 are coupled to the recess regions 33 and 34.

A first recess part 31 is formed around the second bonding region 30 in the top surface of the second frame part 135. The first recess part 31 is formed to cover the circumference of the second bonding region 30. A part 44 of the first body 141 is coupled to the first recess part 31. As shown in FIGS. 1, 2, 9 and 10, a part of the first recess part 31 is exposed through the bottom of the first opening 111.

Figure 10:
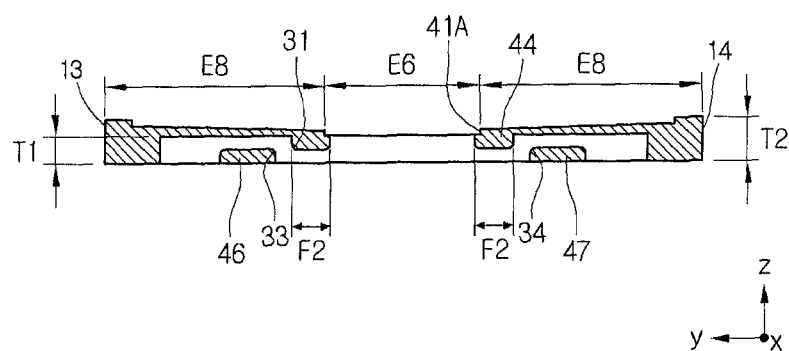
FIG. 10 is a sectional view taken along line B1-B1' of FIG. 8.

In this case, the second extension part 133 protrudes toward the fourth connection part 137 of the first recess part 31. As shown in FIGS. 9 and 10, a width F1 of the second recess part 31 is narrower than a width F2 of another region.

As shown in FIG. 12, the recess regions 38A and 38B, which are recessed lower than the bottom surface of the second lead frame 131, may be provided to the third and fourth protrusions P3 and P4, but the embodiment is not limited thereto. The recess regions 38A and 38B may be formed at a depth of 50% or less of the thickness of the second lead frame 131, for example, in the range of 30% to 50%.

As shown in FIG. 4, a part of the second lead part 139 protrudes toward the first side surface 11 of the first body 141, has a length equal to the length L2 of the second lead frame 131, and is connected to the third to fifth connection parts 136 to 138.

As shown in FIG. 12, recess regions 32E and 32F, which is lower than the bottom surface of the second lead frame 131, is provided to the bottom surface of the second lead part 139. The recess region 23 may be formed at a depth of 50% or less of the thickness of the first lead frame 121, for example, in the range of 30% to 50%. The recess regions 32E and 32F are spaced apart from each other and connected to the second and third holes 32A and 32B. The recess regions 32E and 32F of the second lead part 139 may extend to parts of the third and fifth connection parts 136 and 138.

A plurality of coupling holes 39, which are formed in the form of a via-hole, are provided to the second lead part 139 to be coupled to the first body 141. The coupling holes 39 may be spaced apart from an outside of the second hole 32 to enhance the coupling with the first body 141.

The diameters of the second and third holes 32A and 32B may be formed in the range of 80% to 120% of the width of the second lead part 139 and wider than the diameter D2 of the first hole. The diameters of the second and third holes 32A and 32B may be 15% or more of the width D12 of the second lead frame 131. The width D12 of the second lead frame 131 may be 15% or more of the width D12 of the second lead frame 131. The width D12 of the second lead frame 131 may be in the range of 3.3 mm±0.3 mm, but the embodiment is not limited thereto.

Figure 8:
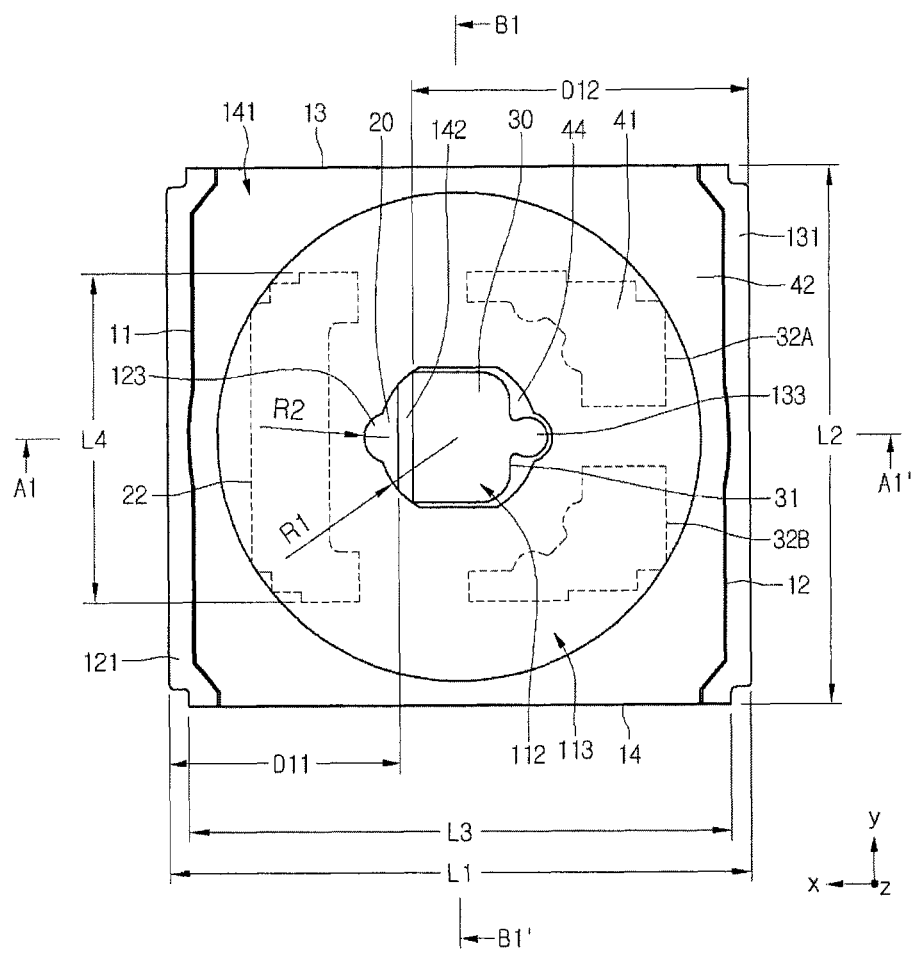
FIG. 8 is a view showing in detail a coupling structure of the lead frame and the first body of the light emitting device of FIG. 1.

The second and third holes 32A and 32B are separated from each other by the fourth connection part 137 and disposed in a corner region of the second frame part 135. As shown in FIG. 8, the first body 141 may be coupled into the second and third holes 32A and 32B. The contact area of the first body 141 with the second lead frame 131 may be increased, so that the coupling strength of the first body 141, a thickness of which is relatively thinner than that of the second body 151, may be enhanced.

The second hole 32A is disposed between the third and fourth connection parts 136 and 137, and the third hole 32B is disposed between the fourth and fifth connection parts 137 and 138.

The third connection part 136 includes a recess region 32D in the top surface thereof. The fourth connection part 137 is disposed between the third and fifth connection parts 136 and 138, and a recess region 32 is provided in the top surface of the fourth connection part 137. The fifth connection part 138 includes a recess region 32C in the top surface thereof. The first body 141, which is coupled to the fourth connection part 137 and the second and third holes 32A and 32B, supports the second bonding region 30 in which the light emitting chip is mounted.

When explaining the structure of the first body 141, the first body 141 is coupled into the first hole 22 and the recess regions 21, 23, 22A, 22B, 28A and 28B of the first lead frame 121, the second and third holes 32A and 32B and the recess regions 21, 32C, 32D, 32E, 32F 33, 34, 38A and 38B of the second lead frame 131.

A thickness T2 of the first body 141 may be 1.25 to 2 times greater than the thickness of the first lead frame 121. The highest position of the top surface of the first body 141 may have a height (T2−T1) lower than the thickness T1 of the first and second lead frames 121 and 131 when measured from the top surfaces of the first and second lead frames 121 and 131. For example, the maximum height of the first body 141 may have a thickness in the range of 0.2 mm~0.25 mm when measured from the top surfaces of the first and second lead frames 121 and 131. An outer part 42 of the first body 141 may have a thickness thinner than those of the first and second lead frames 121 and 131. The outer part 42 of the first body 141 may be located at a position higher than the inner part 41 or may be formed at a thickness thicker than that of the inner part 41. The outer part 42 of the first body 141 may be located lower than the top surface of the light emitting chip 161. An area of the top surface of the inner part 41 of the first body 141 may be greater than that of the top surface of the outer part 42.

The low position of the top surface of the first body 141 may exist on the top surface of an inner surface 41A of the first body 141, and a height of the low position may be equal to the height of the inner surface 41A. The height of the inner surface 41A may correspond to a thickness in the range of 45 μm-60 μm when measured from the top surface of the first lead frame 121. When the thickness is too thin, the corresponding part in the inner surface 41A of the first body 141 may not be formed or broken, so it is preferable to form the inner surface 41A at the thickness of the above range. The inner surface 41A of the first body 141 may be formed at a thickness thinner than that of the light emitting chip 161. For example, the inner surface 41A of the first body 141 may be formed at a thickness of 50% or less of the thickness of the light emitting chip 161, but the embodiment is not limited thereto. In addition, the inner surface 41A of the first body 141 may be formed to have a height lower than that of the top surface of the light emitting chip 161, so that the light emitted from the first light emitting chip 161 in a side direction may be effectively reflected. The height of the inner surface 41A may be in the range of 0.05 mm±0.01 mm.

The inner surface 41A of the first body 141 may be perpendicular or inclined to the top surface of the first lead frame 121, but the embodiment is not limited thereto.

As shown in FIGS. 8 to 10, the first body 141 may include the open region 112, the inner part 41 and the outer part 42. The open region 112 may be equal to or narrower than the bottom area of the first opening 111. When explaining the width of the open region 112, the width E2 in the first direction X may be wider than the width E6 in the second direction Y. The widths E2 and E6 of the open region 112 are a gap between inner surfaces 41A corresponding to each other. The width E2 in the first direction X may be 1.2 to 1.5 times greater than the width E6 in the second direction Y. The width E2 may be in the range of 1.91 mm±0.2 mm and the width E6 may be in the range of 1.41 mm±0.2 mm.

A curvature R2 of the curved surface of the open region 112 corresponding to the first extension part 12 may be in the range of 0.26±0.05 mm, and a curvature R1 of the curved surface connected to the first extension part 123 may be 3 times greater than the curvature R2, for example, in the range of 0.81±0.05 mm.

A top surface of the inner part 41 of the first body 141 may be inclined to the top surface of the first and second lead frames 121 and 131 at a predetermined angle θ1, for example, 5 degrees or less or in the range of 2 degrees to 5 degrees. The inner part 41 of the first body 141 may have a height lower than the outer part 42 and may be inclined, so that the incident light may be effectively reflected. The outer circumference of the inner part 41 of the first body 141 may be formed to have a contour of a circular shape when viewed from the top, but the embodiment is not limited thereto. As another example, the outer circumference of the inner part 41 of the first body 141 may be formed in a polygonal shape or an atypical shape, but the embodiment is not limited thereto.

As shown in FIG. 9, the minimum thickness T4 of a region corresponding to the first hole 22 of the first lead frame 121 in the top surface of the inner part 41 of the first body 141 may be 0.05 mm or more, for example, in the range of 0.05~0.08 mm. The thickness T4 may prevent the coupling strength of the first hole 22 to the part 43 of the first body 141 from being deteriorated.

As shown in FIGS. 9 and 10, when explaining the inner part 41 of the first body 141, a straight-line distance in the first direction (X) is the distances E4 and E5 between the inner surface 41A and the first and second side surfaces 11 and 12, which may be equal to or different from each other. A straight-line distance in the second direction (Y) is the distances E8 between the inner surface 41A and the third and fourth side surfaces 13 and 14.

The inner part 41 of the first body 141 may be the bottom of the concave part 113 concaved with respect to the outer part 42. The width E1 of the concave part 113 may be narrower than the width L3 of the first body 141 and may be formed at 80% or more of the width L3 of the first body 141. The width E1 of the concave part 113 may be formed at 75% or more of the width D1 of the light emitting device, for example, 4.5 mm or more.

The outer part 42 of the first body 141 may include a flat surface or an inclined surface. A height the top surface of the outer part 42 of the first body 141 may be lower than that of the top surface of the light emitting chip 161. The outer part 42 of the first body 141 may be formed to have a predetermined height T3 from the inner part 41, and the height T3 may be in the range of 0.05 mm±0.02 mm.

As shown in FIG. 8, the region, which is the most adjacent to the concave part 113 in the first and second side surfaces 11 and 12 of the first body 141 may convexly protrude along a curvature of the concave part 113 in an outer direction, the embodiment is not limited thereto.

Meanwhile, when explaining the second body 151, the second body 151 is formed on the first body 141 and is spaced apart from the first and second lead frames 121 and 131. The thickness of the second body 151 may be thicker than the thickness T2 of the first body 161, for example, 1.5 times greater than the thickness T2, or may be thicker than that of the light emitting chip 161 and thicker than the high points of the wires 166 and 167 of FIG. 2. For example, the second body 151 may be formed at a thickness in the range of 250 μm to 550 μm, but the embodiment is not limited thereto. The light emitting chip may be formed at a thickness in the above range for light extraction efficiency. The light emitting chip 161 may be formed at a thickness in the range of 80 μm to 400 μm, for example, in the range of 80 μm to 150 μm, but the embodiment is not limited thereto.

The upper portion of the second body 151 may be formed in a concavo-convex structure, an unevenness structure, or a step difference structure. An adhesive layer may be disposed between the top surfaces of the first and second bodies 141 and 151 to bond the top surfaces of the first and second bodies 141 and 151.

The light emitting chip 161 may be disposed on the second bonding region 30 of the second lead frame 131, may be connected to the first and second connection parts 123 and 133 of the first and second lead frames 121 and 131 through the first and second wires 165 and 166. The light emitting chip 161 receives power through the first and second lead frames 121 and 131 to be driven. As another example, the light emitting chip 161 is bonded into the second bonding region 30 of the second lead frame 131 through a die bonding scheme and may be connected to the first extension part 123 of the first lead frame 121 through the first wire 165. The light emitting chip 161 may be bonded to the first lead frame 121 and the second lead frame 131 through a flip scheme.

The light emitting chip 161 may include an LED chip including a semiconductor compound, for example, may include at least one of a UV LED chip, a blue LED chip, a green LED chip, a white LED chip, and a red LED chip. The light emitting chip 161 may include at least one of group II-VI compound semiconductors and group III-V compound semiconductors. An active layer of the light emitting chip 161 may have at least one of a dual bonding structure, a single well structure, a multi-well structure, a single quantum well structure, a multi-quantum well structure, a quantum wire structure, and a quantum dot structure. The active layer may be formed by alternately arranging well/barrier layers. For example, the well/barrier layers may be formed at two to 30 cycles of the stack structure of InGaN/GaN, GaN/AlGaN, InGaN/AlGaN, InGaN/InGaN, or InAlGaN/InAlGaN. In addition, the active layer may include semiconductors such as ZnS, ZnSe, SiC, GaP, GaAlAs, AlN, InN, and AlInGaP, but the embodiment is not limited thereto. The light emission wavelength of the active layer may be emitted as one selected from an ultraviolet band light to a visible band light, but the embodiment is not limited thereto.

The open region 112 of the first body 141 and the first opening 111 of the second body 151 are filled with the transmissive resin layer 171, and the light emitting chip 161 is covered by the transmissive resin layer 171. The transmissive resin layer 171 may make contact with the inner surface 41A of the first body 141 and the part 44 of the first body 141 disposed in the recess region 31.

The transmissive resin layer 171 may be formed of a resin material such as silicon or epoxy. The transmissive resin layer 171 may be formed of a material having transmittance of 70% or more with respect to a wavelength (for example: blue color wavelength) of light emitted from the light emitting chip, for example, 90% or more. The top surface of the transmissive resin layer 171 may be flat or as another example, concave or convex.

The reflective index of the transmissive resin layer 171 may be 1.6 or less, and the reflective index of the second body 151 may be equal to or less than that of the transmissive resin layer 171. In addition, the difference between the reflective index of the second body 151 and the reflective index of the transmissive resin layer 171 may be ±0.2, but the embodiment is not limited thereto.

The transmissive resin layer 171 may include at least one of a filler, a pigment, a diffusing agent, a phosphor material, and a reflective material. The fluorescent material mixed with the transmissive resin layer 171 absorbs a part of the light emitted from the light emitting chip 161 to convert the wavelength of the light. The fluorescent material may include at least one of a yellow phosphor, a green phosphor, a blue phosphor and a red phosphor. For instance, the fluorescent material may include at least one selected from the group consisting of a nitride based phosphor, an oxynitride based phosphor and a sialon based phosphor, which are mainly activated by lanthanoid based elements, such as Eu or Ce; an alkali earth halogen apatite phosphor, which is mainly activated by a lanthanoid based element, such as Eu, or a transient metallic element, such as Mn; an alkali earth metal boric acid halogen phosphor; an alkali earth metal aluminate phosphor; an alkali earth silicate; an alkali earth sulfide; an alkali earth thio-gallate; an alkali earth silicon nitride; a germinate; a rare-earth aluminate mainly activated by a lanthanoid based element, such as Ce; a rare-earth silicate; and an organic chelating agent mainly activated by a lanthanoid based element, such as Eu, but the embodiment is not limited thereto.

In the first embodiment, the first body 141 having a thin thickness and a reflective property may be coupled into the first hole 22 and the recess regions 21, 23, 22A, 22B, 28A and 28B of the first lead frame 121 and the second and third holes 32A and 32B and the recess regions 31, 32C, 32D, 32E, 32F, 33, 34, 38A and 38B of the second lead frame 131. Thus, in the light emitting device having the stack structure of the first and second bodies 141 and 151, the first body 141 may be prevented from being unfastened. In addition, the adhesive strength of the first body and the first and second lead frames 121 and 131 may be prevented to be deteriorated, and moisture permeation may be effectively inhibited.

Figure 15:
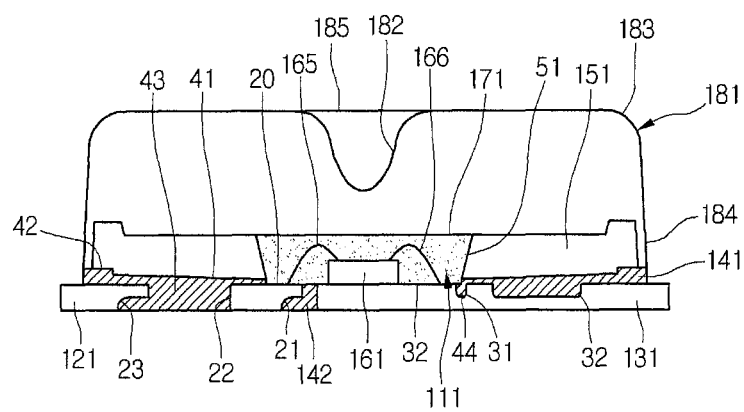
FIG. 15 is a side sectional view showing a light emitting device according to a second embodiment.

FIG. 15 is a side sectional view showing a light emitting device according to a second embodiment. In the description of the second embodiment, the same parts of the first embodiment will be incorporated by reference.

Referring to FIG. 15, the optical lens 181 is provided on the second body 151 and the transmissive resin layer 171. The optical lens 181 may include a transmissive resin material such as silicon or epoxy, or a glass material. The refractive index of the optical lens 181 may be equal to or lower than that of the transmissive resin layer 171. The optical lens 181 may make contact with the upper portions of the transmissive resin layer 171 and the second body 151.

The optical lens 181 includes a total reflection surface 182 and a light exit surface 183. The total reflection surface reflects the light incident thereon. The total reflection surface 182 is concavely recessed in an upper direction of the light emitting chip 161, and is spaced apart from the transmissive resin layer 171. The total reflection surface 182 corresponds to the light emitting chip 161. The total reflection surface 182 has a depth lower than the top surface of the optical lens 181 in the direction of the light emitting chip 161 and is concavely curved, so that the incident light is refracted and is partly transmitted. The optical lens 181 may allow the light transmitted through the second body 151 to radiate at a wider light viewing angle.

The total reflection surface 182 may be filled with a reflective material 185 which includes resin, such as silicon or epoxy, into which metallic oxide is added.

The light exit surface 183 is connected to the circumference of the total reflection surface 182 and includes a curved shape to extract light. In addition, the light exit surface 183 may be formed in a hemispherical shape and may be formed in a circular or ellipsoidal shape when seen from the top for the purpose of light distribution.

The outer part 184 of the optical lens 181 may make contact with the outer surfaces of the first and second bodies 141 and 151, but the embodiment is not limited thereto. To this end, the second body 151 may have a width narrower than that of the first body 141 or a part of the outer part 42 of the first body 141 may be exposed.

A protrusion may be provided on the second body 151. The protrusion may enhance the coupling strength with the optical lens 181, but the embodiment is not limited thereto. The optical lens 181 may be injection-molded on the second body 151 or may be adhesive to the second body after being separately fabricated, but the embodiment is not limited thereto.

Figure 16:
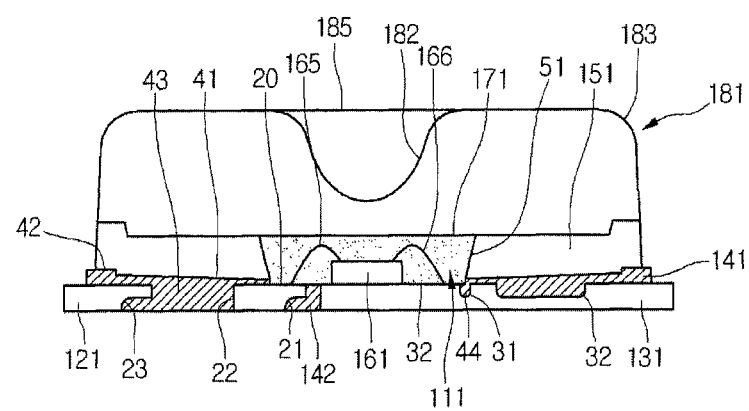
FIG. 16 is a side sectional view showing a light emitting device according to a third embodiment.

FIG. 16 is a side sectional view showing a light emitting device according to a third embodiment. In the description of the third embodiment, the same parts of the first embodiment will be incorporated by reference.

Referring to FIG. 6, the total reflection surface 182 of the optical lens 181 may be concavely recessed from the top surface of the optical lens 181. A diameter of a half position of the depth of the total reflection surface 182 may be narrower than the width of the top surface of the transmissive resin layer 171 and may be wider than the width of the light emitting chip 161. The total reflection surface 192 may be filled with a reflective material 185 which includes resin, such as silicon or epoxy to which metallic oxide is added. The total reflection surface 182 may effectively reflect the light traveling from the light emitting chip 162 in the normal direction.

In addition, the optical lens 181 may be stacked on the second body 151 and spaced apart from the first body 141.

Figure 17:
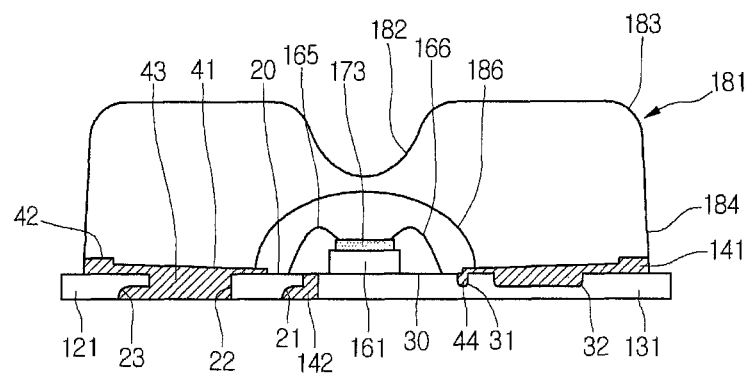
FIG. 17 is a side sectional view showing a light emitting device according to a fourth embodiment.

FIG. 17 is a side sectional view showing a light emitting device according to a fourth embodiment. In the description of the second embodiment, the same parts of the first embodiment will be incorporated by reference.

Referring to FIG. 17, in the light emitting device, the optical lens 181 is coupled onto the first body 141. The outer part 184 of the optical lens 181 may be aligned in line with the top surfaces of the first body 141, or may make contact with the top surfaces of the first and second lead frames 121 and 131.

The optical lens 181 includes the concave part 184 having a hemispherical shape therein. The concave part 186 protrudes over the light emitting chip 161 to cover the light emitting chip 161.

The concave part 186 may be an empty space or may be filled with a transmissive material such as resin, but the embodiment is not limited thereto.

A phosphor layer 173 is formed on the light emitting chip 161. The phosphor layer 173 is provided on the top surface of the light emitting chip 161 to convert a wavelength of incident light.

The concave part 186 of the light emitting device may diffuse the light emitted from the light emitted from the light emitting chip 161. The diffused light is reflected upon the total reflection surface 182 of the optical lens 181 and is radiated by the light exit surface 183.

A part of the light diffused by the concave part 186 may be reflected by the first body 141 and be extracted through the optical lens 181.

The fourth embodiment provides the structure having the function of the second body of the first embodiment by using the optical lens 181.

Figure 18:
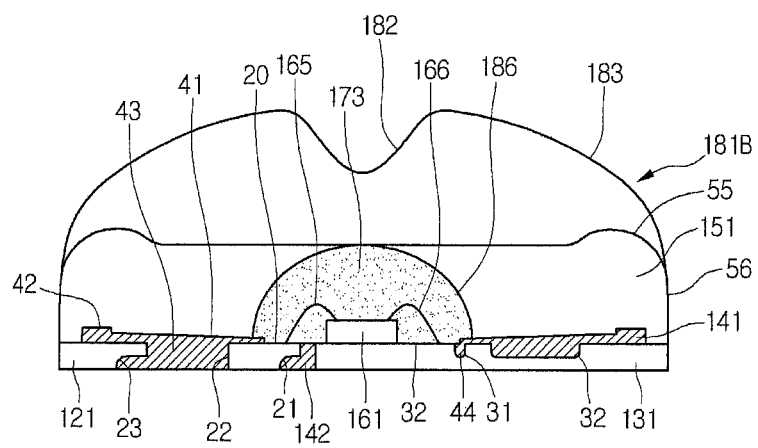
FIG. 18 is a side sectional view showing a light emitting device according to a fifth embodiment.

FIG. 18 is a side sectional view showing a light emitting device according to a fifth embodiment. In the description of the fifth embodiment, the same parts of the first embodiment will be incorporated by reference.

Referring to FIG. 18, the light emitting device includes a transmissive resin layer 173 having a hemispherical shape on the light emitting chip 161. The second body 151 is formed around the transmissive resin layer 173. The second body 151 may be formed of a transmissive material to effectively guide the light transmitted through the transmissive resin layer 173 and reflected by the first body 141.

In addition, the transmissive resin layer 173 may make contact with the top surface of the inner part 41 of the first body 141, so that the coupling between the transmissive resin layer 173 and the first body 141 may be improved.

The outer part 55 of the second body 151 may include a curved shape and the outer part 55 having the curved shape may improve the extraction efficiency of light traveling in the second body 151. That is, the outer part 55 of the second body 151 may be connected to the light exit surface 183 of the optical lens 181B, so that the outer part 55 may be operated as the light exit surface.

An outer side surface 56 of the second body 151 may be connected to the outer part 55 and may be disposed outward than an outer side surface of the first body 141, but the embodiment is not limited thereto.

Figure 19:
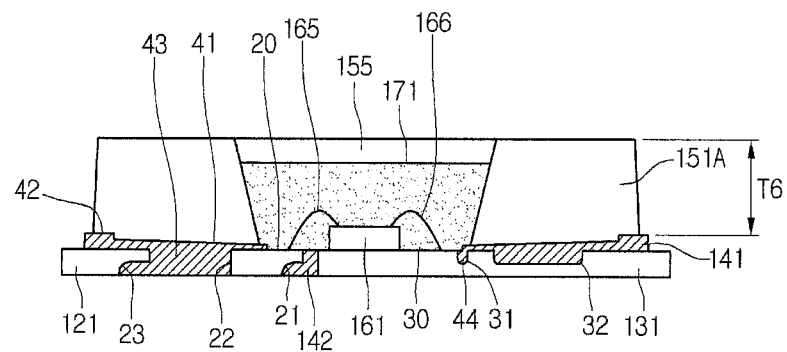
FIG. 19 is a side sectional view showing a light emitting device according to a sixth embodiment.

FIG. 19 is a side sectional view showing a light emitting device according to a sixth embodiment. In the description of the sixth embodiment, the same parts of the first embodiment will be incorporated by reference.

Referring to FIG. 19, the light emitting device includes the reflective layer 155 on the transmissive resin layer 171 and the second body 151A around the transmissive resin layer 171 and the reflective layer 155. The reflective layer 155 may be formed of the same material as that of the first body 141. For example, metallic oxide may be added to the resin material such as silicon or epoxy. The metallic oxide may include at least one of $TiO_2$, $SiO_2$, and $Al_2O_3$. The metallic material may be added to the body 141 at the rate of 5 wt % or more.

The reflective layer 155 makes contact with the top surface of the transmissive resin layer 171 to effectively reflect the light emitted from the light emitting chip 161. To this end, the top surface of the first body 141 may be rough to reflect the light reflected upon the reflective layer 155, but the embodiment is not limited thereto.

The thickness T6 of the second body 151A may be equal to or thicker than the sum of thicknesses of the transmissive resin layer 171 and the reflective layer 155. The top surface of the second body 151A may be flat or curved to have a hemispherical shape, but the embodiment is not limited thereto. The optical lens may make contact or non-contact with the reflective layer 155, but the embodiment is not limited thereto.

The light emitting device according to the embodiment may increase the light viewing angle. The embodiment may provide a light emitting device having a light viewing angle of 140 degrees or more. According to the embodiment, the number of light emitting device mounted on the substrate may be reduced. Further, according to the embodiment, the coupling strength between the lead frame and the body may be enhanced. In addition, the reliability of the light emitting device and the lighting apparatus having the same according to the embodiment may be improved.

Figure 20:
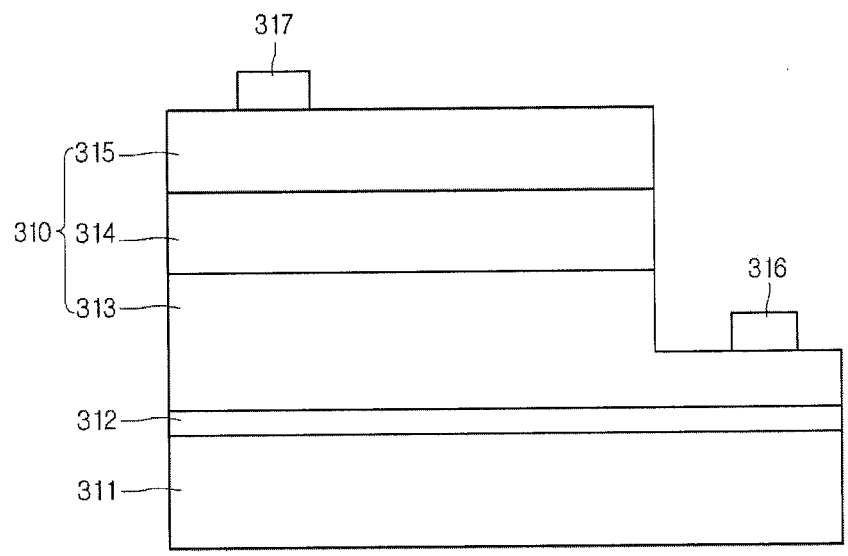
FIG. 20 is a sectional view showing a light emitting chip according to an embodiment.

FIG. 20 is a side sectional view showing one example of a light emitting chip according to the embodiment.

Referring to FIG. 20, the light emitting chip includes a substrate 311, a buffer layer 312, a light emitting structure 310, a first electrode 316, and a second electrode 317. The substrate 311 may include a substrate including a transmissive material or a non-transmissive material, and may include a conductive substrate or an insulating substrate.

The buffer layer 312 reduces the lattice constant difference between the materials constituting the substrate 311 and the light emitting structure 310, and may include a nitride semiconductor. A nitride semiconductor layer, which is not doped with dopants, is further provided between the buffer layer 312 and the light emitting structure 310, so that the crystal quality can be improved.

The light emitting structure 310 may include a first conductive semiconductor layer 313, an active layer 314 and a second conductive semiconductor layer 315.

The first conductive semiconductor layer 313 may include group III to V compound semiconductors doped with a first conductive dopant. The first conductive semiconductor layer 313 may be formed of the semiconductor material having the compositional formula of $In_xAl_yGa_{1-x-y}N$ ($0 \leq x \leq 1$, $0 \leq y \leq 1$, $0 \leq x+y \leq 1$). The first conductive semiconductor layer 313 may include a stack structure of layers including at least one of the compound semiconductors such as GaN, InN, AlN, InGaN, AlGaN, InAlGaN, AlInN, AlGaAs, GaP, GaAs, GaAsP, and AlGaInP. The first conductive semiconductor layer 313 includes an N-type semiconductor layer and the first conductive dopant is an N-type dopant including Si, Ge, Sn, Se or Te.

A first clad layer may be disposed between the first conductive semiconductor layer 313 and the active layer 314. The first clad layer may include a GaN based semiconductor and may have the bandgap wider than that of the active layer 314. The first clad layer is formed in the first conductive type so that a carrier is confined.

The active layer 121 is formed on the first conductive semiconductor layer 313. The active layer 121 may include one selected from a single quantum well structure, a multiple quantum well (MQW) structure, a quantum wire structure, and a quantum dot structure. The active layer 314 has the cycle of the well and barrier layers. The well layer may have the composition formula of $In_xAl_yGa_{1-x-y}N$ ($0 \leq x \leq 1$, $0 \leq y \leq 1$, $0 \leq x+y \leq 1$), and the barrier layer may have the composition formula of $In_xAl_yGa_{1-x-y}N$ ($0 \leq x \leq 1$, $0 \leq y \leq 1$, $0 \leq x+y \leq 1$). At least one cycle of the well/barrier layers may be used through the stack structure of InGaN/GaN, GaN/AlGaN, InGaN/AlGaN, InGaN/InGaN, and InAlGaN/InAlGaN. The barrier layer may include a semiconductor material having the bandgap higher than the bandgap of the well layer.

The second conductive layer 315 is formed on the active layer 314. The second conductive layer 315 includes a semiconductor doped with second conductive dopants, for example, includes a semiconductor having the composition formula of $In_xAl_yGa_{1-x-y}N$ ($0 \leq x \leq 1$, $0 \leq y \leq 1$, $0 \leq x+y \leq 1$). In detail, the second conductive semiconductor layer 315 may include one selected from compound semiconductors such as GaN, InN, AlN, InGaN, AlGaN, InAlGaN, AlInN, AlGaAs, GaP, GaAs, GaAsP, and AlGaInP. If the second conductive semiconductor layer 315 is a P type semiconductor layer, the semiconductor conductive dopant includes the P type dopant such as Mg, Zn, Ca, Sr, or Ba.

The second conductive semiconductor layer 315 may include a superlattice structure, and the superlattice structure may include an InGaN/GaN superlattice structure or am AlGaN/GaN superlattice structure. The superlattice structure of the second conductive semiconductor layer 315 abnormally spreads the current, thereby protecting the active layer 314.

In addition, the light emitting structure 310 may have an opposite conductive type. For example, the first conductive semiconductor layer 313 may include a P type semiconductor layer, and the second conductive semiconductor layer 315 may include an N type semiconductor layer. The second conductive semiconductor layer 315 may be provided thereon with a first conductive semiconductor layer having the polarity opposite to the second conductive type polarity.

The light emitting structure 310 may be realized by using one of an N-P junction structure, a P-N junction structure, an N-P-N junction structure, and a P-N-P junction structure. The "P" represents a P type semiconductor, the "N" represents an N type semiconductor layer, and the "-" represents that the P type semiconductor is directly or indirectly connected to the N type semiconductor. Hereinafter, a case that the uppermost layer of the light emitting structure 310 is the second conductive semiconductor layer 315 will be described for the convenience of explanation.

The first electrode 316 is provided on the first conductive semiconductor layer 313, and the second electrode 317 having a current spreading layer is provided on the second conductive semiconductor layer 315.

Figure 21:
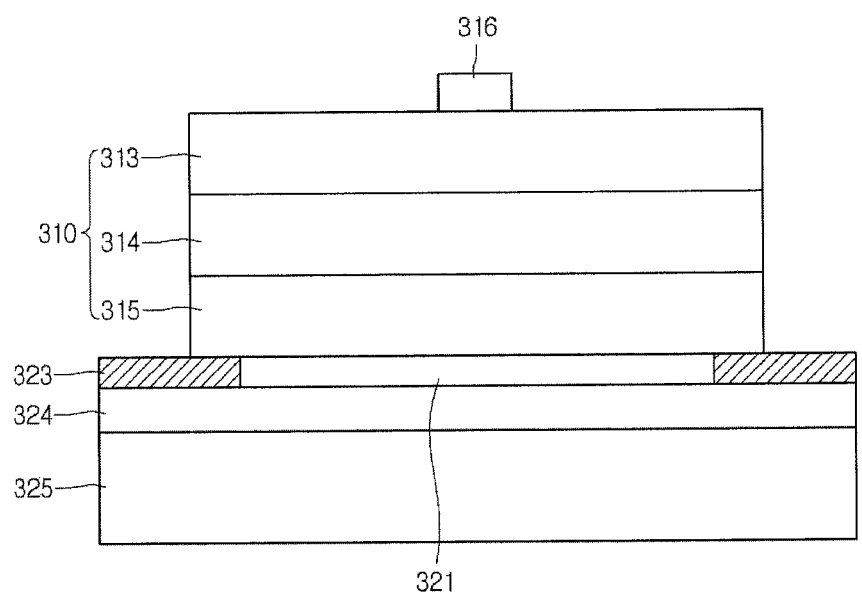
FIG. 21 is a sectional view showing a light emitting chip according to another embodiment.

FIG. 21 is a sectional view showing another example of the light emitting chip according to the embodiment. Hereinafter, in the following description of the embodiment, the details of the same parts as that of FIG. 20 will be omitted except for brief description.

Referring to FIG. 21, in a light emitting chip according to the embodiment, a contact layer 321 is formed under a light emitting structure 310, a reflective layer 324 is formed under the contact layer 321, a support member 325 is formed under the reflective layer 324, and a protective layer 323 may be formed around the reflective layer 324 and the light emitting structure 310.

The light emitting chip may be formed by removing a growth substrate after forming a contact layer 321, a protective layer 323, a reflective layer 324, and a support member 325 under the second conductive semiconductor layer 315.

The contact layer 321 may make ohmic-contact with a lower layer of the light emitting structure 310, for example, the second conductive semiconductor layer 315, and may include a metallic oxide, a metallic nitride, an insulating material, or a conductive material. For example, the contact layer 321 may include ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), Ag, Ni, Al, Rh, Pd, Ir, Ru, Mg, Zn, Pt, Au, Hf, and the selective combination thereof. The contact layer 321 may be formed in a multi-layer structure by using a metallic material and a transparent material such as IZO, IZTO, IAZO, IGZO, IGTO, AZO, or ATO. For example, the contact layer 321 may have the stack structure of IZO/Ni, AZO/Ag, IZO/Ag/Ni, or AZO/Ag/Ni. A layer to block current may be further formed in the contact layer 321 corresponding to the electrode 316.

The protective layer 323 may include a metallic oxide or an insulating material. For example, the protective layer 323 may selectively include ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $SiO_2$, $SiO_x$, $SiO_xN_y$, $Si_3N_4$, $Al_2O_3$, or $TiO_2$. The protective layer 323 may be formed through a sputtering scheme or a deposition scheme. The metal constituting the reflective layer 324 may prevent the layers of the light emitting structure 310 from being shorted.

The reflective layer 324 may include metal such as Ag, Ni, Al, Rh, Pd, Ir, Ru, Mg, Zn, Pt, Au, Hf, or the selective combination thereof. The reflective layer 324 may have a width greater than the width of the light emitting structure 310, thereby improving the light reflection efficiency. A metallic layer for bonding and a metallic layer for thermal diffusion may be further provided between the reflective layer 324 and the support member 325, but the embodiment is not limited thereto.

The support member 325 serves as a base substrate, and may include metal such as Cu, Au, Ni, Mo, or Cu—W, and a carrier wafer, such as Si, Ge, GaAs, ZnO, and SiC. An adhesive layer may be further formed between the support member 325 and the reflective layer 324, and bonds the two layers to each other. The disclosed light emitting chip is four the illustrative purpose, and the embodiment is not limited thereto. The light emitting chip may be selective applied to the light emitting device according to the embodiment, but the embodiment is not limited thereto.

<Lighting System>

The light emitting device according to the embodiment is applicable to a lighting system. The lighting system includes a structure in which a plurality of light emitting devices are arrayed. The lighting system includes a display apparatus shown in FIGS. 22 and 23, a lighting apparatus shown in FIG. 24, a lighting lamp, a camera flash, a signal lamp, a headlamp for a vehicle, and an electronic display.

Figure 22:
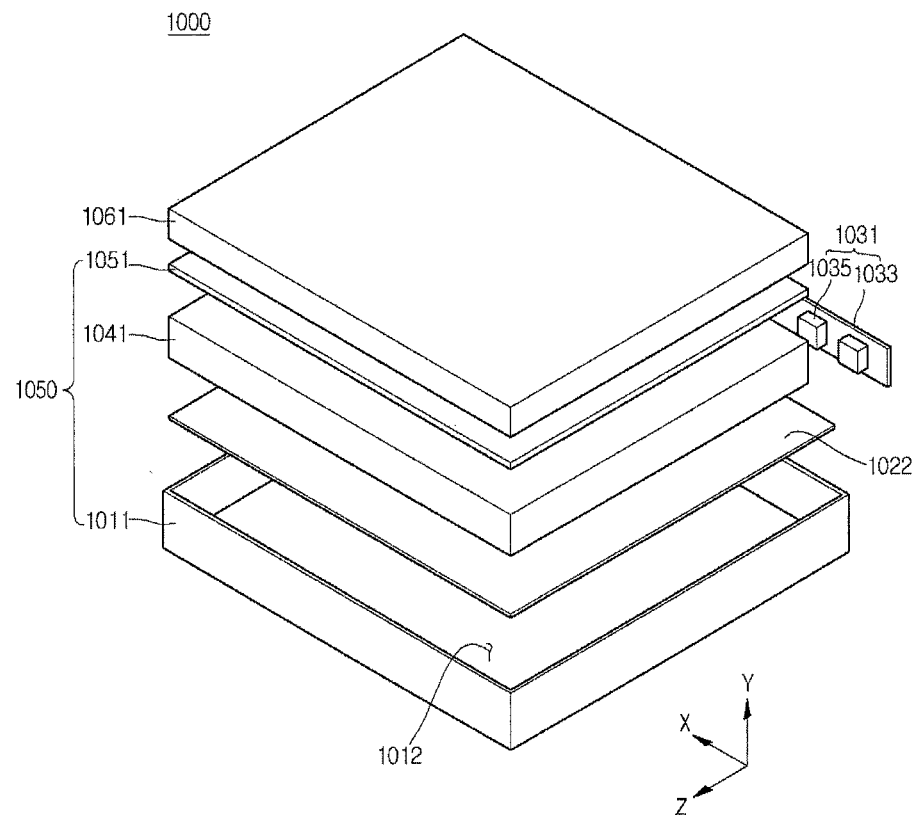
FIG. 22 is a perspective view showing a display apparatus having the light emitting device according to the embodiment.

FIG. 22 is an exploded perspective view showing a display apparatus having the light emitting device according to the embodiment.

Referring to FIG. 22, a display apparatus 1000 according to the embodiment includes a light guide plate 1041, a light source module 1031 to supply light to the light guide plate 1041, a reflective member 1022 under the light guide plate 1041, an optical sheet 1051 on the light guide plate 1041, a display panel 1061 on the optical sheet 1051, and a bottom cover 1011 to receive the light guide plate 1041, the light source module 1031, and the reflective member 1022, but the embodiment is not limited thereto.

The bottom cover 1011, the reflective sheet 1022, the light guide plate 1041, the optical sheet 1051, and the light unit 1050 may be defined as a backlight unit.

The light guide plate 1041 diffuses the light supplied from the light source module 1033 to provide surface light. The light guide plate 1041 may include a transparent material. For example, the light guide plate 1041 may include one of acryl-based resin, such as PMMA (polymethyl methacrylate, PET (polyethylene terephthalate), PC (polycarbonate), COC (cyclic olefin copolymer) and PEN (polyethylene naphthalate) resin.

The light source module 1031 is disposed on at least one side of the light guide plate 1041 to supply the light to at least one side of the light guide plate 1041. The light source module 1031 serves as the light source of the display device.

At least one light source module 1031 is disposed to directly or indirectly supply the light from one side of the light guide plate 1041. The light source module 1031 may include a board 1033 and the light emitting device according to the embodiments or the light emitting device 1035. The light emitting device or the light emitting device 1035 are arranged on the board 1033 while being spaced apart from each other at the predetermined interval.

The board 1033 may include a printed circuit board (PCB) including a circuit pattern (not shown). In addition, the board 1031 may also include a metal core PCB (MCPCB) or a flexible PCB (FPCB) as well as a typical PCB, but the embodiment is not limited thereto. If the light emitting device 1035 is installed on the side of the bottom cover 1011 or on a heat dissipation plate, the board 1033 may be omitted. The heat dissipation plate partially makes contact with the top surface of the bottom cover 1011.

In addition, the light emitting device 1035 are arranged such that light exit surfaces to discharge light of the light emitting device 1035 are spaced apart from the light guide plate 1041 by a predetermined distance on the board 1033, but the embodiment is not limited thereto. The light emitting device 1035 may directly or indirectly supply the light to a light incident surface, which is one side of the light guide plate 1041, but the embodiment is not limited thereto.

The reflective member 1022 is disposed below the light guide plate 1041. The reflective member 1022 reflects the light, which is traveled downward through the bottom surface of the light guide plate 1041, toward the display panel 1061, thereby improving the brightness of the light unit 1050. For example, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light source module 1031, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for example, is an LCD panel including first and second transparent substrates, which are opposite to each other, and a liquid crystal layer interposed between the first and second substrates. A polarizing plate can be attached to at least one surface of the display panel 1061, but the embodiment is not limited thereto. The display panel 1061 displays information by allowing the light to pass therethrough. The display device 1000 can be applied to various portable terminals, monitors of notebook computers, monitors or laptop computers, and televisions.

The optical sheet 1051 is disposed between the display panel 1061 and the light guide plate 1041 and includes at least one transmissive sheet. For example, the optical sheet 1051 includes at least one selected from the group consisting of a diffusion sheet, a horizontal and vertical prism sheet, and a brightness enhanced sheet. The diffusion sheet diffuses the incident light, the horizontal and vertical prism sheet concentrates the incident light onto the display panel 1061, and the brightness enhanced sheet improves the brightness by reusing the lost light. In addition, a protective sheet can be disposed on the display panel 1061, but the embodiment is not limited thereto.

The light guide plate 1041 and the optical sheet 1051 can be disposed in the light path of the light source module 1031 as optical members, but the embodiment is not limited thereto.

Figure 23:
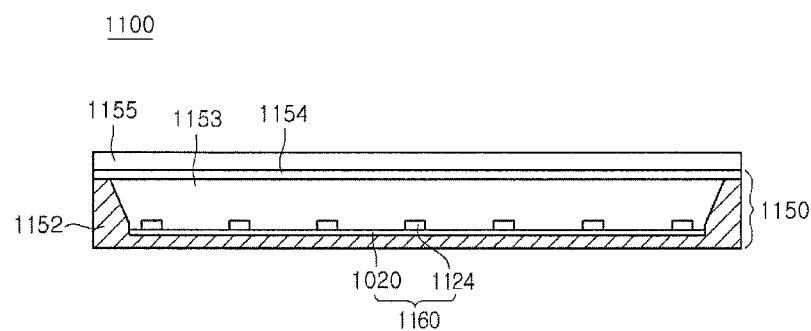
FIG. 23 is a sectional view showing a display apparatus having the light emitting device according to the embodiment.

FIG. 23 is a sectional view showing a display apparatus according to the embodiment.

Referring to FIG. 23, the display device 1100 includes a bottom cover 1152, a board 1120 on which the light emitting device 1124 are arrayed, an optical member 1154, and a display panel 1155.

The board 1120 and the light emitting device 1124 may constitute the light source module 1160. In addition, the bottom cover 1152, at least one light source module 1160, and the optical member 1154 may constitute the light unit 1150. The bottom cover 1151 can be disposed with a receiving section 1153, but the embodiment is not limited thereto. The light source module 1160 includes a board 1120, and a plurality of light emitting devices arranged on the board 1120 or a light emitting device 1124.

The optical member 1154 may include at least one selected from the group consisting of a lens, a light guide plate, a diffusion sheet, a horizontal and vertical prism sheet, and a brightness enhanced sheet. The light guide plate may include PC or PMMA (Poly methyl methacrylate). The light guide plate can be omitted. The diffusion sheet diffuses the incident light, the horizontal and vertical prism sheet concentrates the incident light onto a display region, and the brightness enhanced sheet improves the brightness by reusing the lost light.

The optical member 1154 is disposed above the light source module 1160 in order to convert the light emitted from the light source module 1160 into the surface light.

Figure 24:
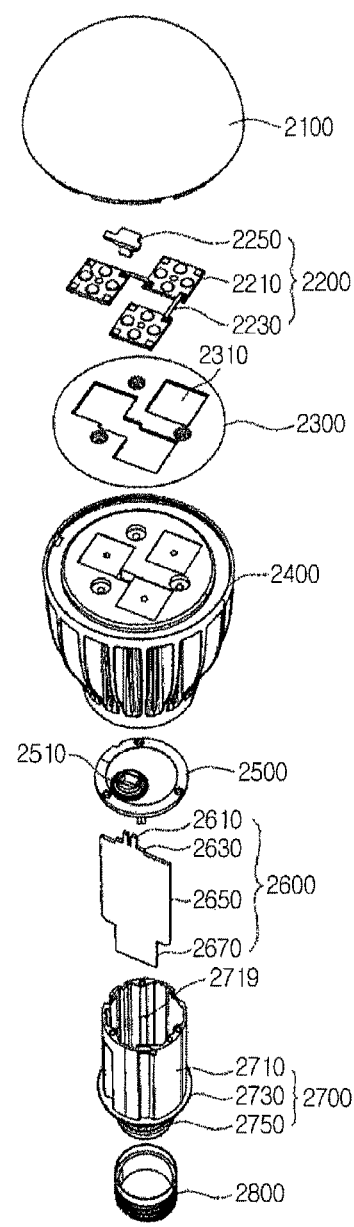
FIG. 24 is an exploded perspective view showing a lighting device having the light emitting device according to the embodiment.

FIG. 24 is an exploded perspective view showing a lighting device having the light emitting device according to the embodiment.

Referring to FIG. 24, the lighting device according to the embodiment may include a cover 2100, a light source module 2200, a heat radiation member 2400, a power supply part 2600, an inner case 2700, and a socket 2800. In addition, the light emitting device according to the embodiment may further include at least one of a member 2300 and a holder 2500. The light source module 2200 may include the light emitting device according to the embodiment.

For example, the cover 2100 has the shape of a bulb, or a hemispherical shape. The cover 2100 may have a hollow structure, and a portion of the cover 2100 may be open. The cover 2100 may be optically connected to the light source module 2200, and may be coupled with the heat radiation member 2400. The cover 2100 may have a recess part coupled with the heat radiation member 2400.

The inner surface of the cover 2100 may be coated with ivory white pigments serving as a diffusing agent. The light emitted from the light source module 2200 may be scattered or diffused by using the ivory white material, so that the light can be discharged to the outside.

The cover 2100 may include glass, plastic, PP, PE, or PC. In this case, the PC represents superior light resistance, superior heat resistance, and superior strength. The cover 2100 may be transparent so that the light source module 2200 may be recognized at the outside. In addition, the cover 2100 may be opaque. The cover 2100 may be formed through a blow molding scheme.

The light source module 2200 may be disposed at one surface of the heat radiation member 2400. Accordingly, the heat emitted from the light source module 2200 is conducted to the heat radiation member 2400. The light source module 2200 may include a light emitting device 2210, a connection plate 2230, and a connector 2250.

The member 2300 is disposed on the top surface of the heat radiation member 2400, and has a guide groove 2310 having a plurality of light emitting devices 2210 and a connector 2250 inserted into the guide groove 2310. The guide groove 2310 corresponds to the substrate of the light emitting device 2210 and the connector 2250.

White pigments may be applied to or coated on the surface of the member 2300. The member 2300 reflects light, which reflected by the inner surface of the cover 2100 to return to the light source module 2200, toward the cover 2100. Accordingly, the light efficiency of the lighting apparatus according to the embodiment can be improved.

The member 2300 may include an insulating material. The connection plate 2230 of the light source module 2200 may include an electric-conductive material. Accordingly, the heat radiation member 2400 may be electrically connected to the connection plate 2230. The member 2300 includes an insulating material to prevent the electrical short between the connection plate 2230 and the heat radiation member 2400. The heat radiation member 2400 receives heat from the light source module 2200 and the heat from the power supply part 2600 and radiates the heats.

The holder 2500 blocks a receiving groove 2719 of an insulating part 2710 disposed in an internal case 2700. Accordingly, the power supply part 2600 received in the insulating part 2710 of the internal case 2700 is sealed. The holder 2500 has a guide protrusion part 2510. The guide protrusion part 2510 may include a hole allowing a protrusion part 2610 of the power supply part 2600 to pass therethrough.

The power supply part 2600 processes and transforms an electrical signal received from the outside and supplies the electrical signal to the light source module 2200. The power supply part 2600 is received in the receiving groove 2719 of the internal case 2700, and sealed in the internal case 2700 by the holder 2500.

The power supply part 2600 may include a protrusion part 2610, a guide part 2630, a base 2650, and an extension part 2670.

The guide part 2630 protrudes outward from one side of the base 2650. The guide part 2630 may be inserted into the holder 2500. A plurality of parts may be disposed on one surface of the base 2650. For example, the parts include a DC converter, a driving chip to drive the light source module 2220, and an ESD (electrostatic discharge) protective device to protect the light source module 2200, but the embodiment is not limited thereto.

The extension part 2670 protrudes outward from another side of the base 2650. The extension part 2670 is inserted into the connection part 2750 of the internal case 2700, and receives an electrical signal from the outside. For example, the extension part 2670 may be equal to or less than the width of the connection part 2750 of the internal case 2700. The extension part 2670 may be electrically connected to the socket 2800 through a wire.

The internal case 2700 may be disposed therein with a molding part together with the power supply part 2600. The molding part is formed by hardening a molding liquid, so that the power supply part 2600 may be fixed into the internal case 2700.

The light emitting device according to the embodiment may increase the light viewing angle. For example, the embodiment may provide a light emitting device having a light viewing angle of 140 degrees or more. According to the embodiment, the number of light emitting device mounted on the substrate may be reduced. Further, according to the embodiment, the coupling strength between the lead frame and the body may be enhanced. In addition, the reliability of the light emitting device and the lighting apparatus having the same according to the embodiment may be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
    a first lead frame;
    a second lead frame spaced apart from the first lead frame;
    a first body disposed on the first and second lead frames and including an open region on top surfaces of the first and second lead frames;
    a second body disposed on the first body and including a first opening on the open region of the first body;
    a light emitting chip on a top surface of at least one of the first and second lead frames and disposed in the first opening and the open region; and
    a transmissive layer disposed on the light emitting chip,
    wherein the first body and the second body are formed of a resin material,
    wherein the first body includes a reflectance material,
    wherein the second body includes a transmissive material,
    wherein a top surface of the first body is located at a position lower than a position of a top surface of the light emitting chip,
    wherein the top surface of the first body has an inclined part around the light emitting chip, and
    wherein the second body includes a bottom surface located at a position lower than the position of the top surface of the light emitting chip,
    wherein the first body includes an upper portion and a lower portion under the upper portion,
    wherein the upper portion of the first body is disposed on the top surfaces of the first and second lead frames,
    wherein the lower portion of the first body is coupled to the first and second lead frames,
    wherein the upper portion of the first body and the second body is disposed around the light emitting chip,
    wherein the first opening is penetrated through the second body in a vertical direction,
    wherein the open region is penetrated through the upper portion of the first body in the vertical direction,
    wherein the transmissive layer is disposed in the first opening and the open region,
    wherein the second body is disposed around the transmissive layer, and
    wherein the inclined part of the top surface of the first body is vertically overlapped with the second body on the upper portion of the first body.

2. The light emitting device of claim 1, wherein the first body includes a gap part between the first and second lead frames.

3. The light emitting device of claim 1, wherein the second body has an inclined surface around the light emitting chip and the first opening.

4. The light emitting device of claim 1, wherein the first body has a thickness thinner than a thickness of the second body.

5. The light emitting device of claim 1, wherein the first body includes at least one of $TiO_2$, $SiO_2$, $Al_2O_3$.

6. The light emitting device of claim 1, wherein the inclined part is closer to the light emitting chip than an outer lateral surface of the first body.

7. The light emitting device of claim 1, wherein the bottom surface of the second body is spaced apart from the top surfaces of the first and second lead frames.

8. The light emitting device of claim 1, wherein the upper portion of the first body is disposed between the second body and the first and second lead frames.

9. The light emitting device of claim 1, wherein entire top surfaces of the first and second lead frames are located at a lower position than the top surface of the first body.

10. A light emitting device comprising:
a plurality of lead frames including a first lead frame and a second lead frame spaced apart from the first lead frame;
a first body disposed on the first and second lead frames and including an open region on top surfaces of the first and second lead frames;
a second body disposed on the first body and including a first opening on the open region of the first body;
a light emitting chip on a top surface of at least one of the first and second lead frames and disposed in the first opening and the open region; and
a transmissive layer disposed on the light emitting chip,
wherein the first body and the second body are formed of a resin material,
wherein the first body includes a reflectance material,
wherein the first body includes a material having reflectance higher than reflectance of the second body,
wherein a top surface of the first body is located at a position lower than a position of a top surface of the light emitting chip,
wherein the second body includes a bottom surface located at a position lower than the position of the top surface of the light emitting chip,
wherein the bottom surface of the second body includes an inclined surface with respect to the top surfaces of the first and second lead frames, and
wherein the top surface of the first body has an inclined part around the light emitting chip,
wherein the first body includes an upper portion and a lower portion under the upper portion,
wherein the upper portion of the first body is disposed on the top surfaces of the first and second lead frames,
wherein the lower portion of the first body is coupled to the first and second lead frames,
wherein the upper portion of the first body and the second body is disposed around the light emitting chip,
wherein the first opening is penetrated through the second body in a vertical direction,
wherein the open region is penetrated through the upper portion of the first body in the vertical direction,
wherein the transmissive layer is disposed in the first opening and the open region,
wherein the second body is disposed around the transmissive layer, and
wherein the inclined part of the top surface of the first body is vertically overlapped with the second body on the upper portion of the first body.

11. The light emitting device of claim 10, wherein the first lead frame comprises a first hole which is disposed under an inner part of the first body and has an area greater than an area of a bottom surface of the light emitting chip.

12. The light emitting device of claim 10, wherein a top surface of the inclined part of the first body is inclined at an angle in a range of 2° to 5° with respect to the top surfaces of the first and second lead frames, and
wherein the top surface of the inclined part of the first body contacts the bottom surface of the second body.

13. The light emitting device of claim 12, wherein an outer part of the first body has a thickness thicker than a thickness of the inclined part on the top surfaces of the first and second lead frames.

14. The light emitting device of claim 12, wherein the inclined part is closer to the light emitting chip than an outer part of the first body.

15. The light emitting device of claim 10, wherein an entire top surface of the first body is located at a position lower than a position of the top surface of the light emitting chip.

16. The light emitting device of claim 10, wherein the bottom surface of the second body contacts the top surface of the first body.

17. The light emitting device of claim 10, wherein the lower part of the first body is aligned in line with bottom surfaces of the first and second lead frames.

18. The light emitting device of claim 10, wherein the upper portion of the first body is disposed between the second body and the plurality of lead frames.

19. The light emitting device of claim 10, wherein entire top surfaces of the first and second lead frames are located at a lower position than the top surface of the first body.

20. The light emitting device of claim 10, further comprising an optical lens disposed on a top surface of the transmissive layer and a top surface of the second body.

* * * * *